United States Patent [19]
Jones

[11] Patent Number: 5,351,688
[45] Date of Patent: Oct. 4, 1994

[54] NMR QUADRATURE DETECTION SOLENOIDAL COILS

[75] Inventor: Randall W. Jones, Bellevue, Nebr.

[73] Assignee: Univ. of NE Board of Regents, Lincoln, Nebr.

[21] Appl. No.: 106,635

[22] Filed: Aug. 16, 1993

[51] Int. Cl.⁵ .............................................. A61B 5/055
[52] U.S. Cl. ................................... 128/653.5; 324/318; 324/322
[58] Field of Search .......................... 128/653.2, 653.5; 324/318, 322

[56] References Cited

U.S. PATENT DOCUMENTS 4,766,383  8/1988  Fox et al. ............................ 324/318
5,057,777  10/1991  Kurczewski ....................... 324/318
5,196,796  3/1993  Misic et al. ......................... 324/322

Primary Examiner—Ruth S. Smith
Attorney, Agent, or Firm—Zarley, McKee, Thomte, Voorhees & Sease

[57] ABSTRACT

An NMR shoulder coil includes a generally ring-shaped transverse parallel-wound solenoidal coil oriented in a vertical plane. Annular anterior and posterior parallel-wound solenoids are mounted perpendicularly and diametric to the transverse vertical coil. The transverse solenoid is associated with the anterior and posterior solenoids in an electrically quadrature sense, to receive NMR signals associated with their respective axes. The anterior and posterior solenoids are preferably mounted in planes which are approximately 30° from parallel to one another and diverge medially.

11 Claims, 4 Drawing Sheets

NMR QUADRATURE DETECTION SOLENOIDAL COILS

TECHNICAL FIELD

The present invention relates generally to magnetic resonance imaging (MRI) and more particularly to local coils for use in receiving MRI signals.

BACKGROUND OF THE INVENTION

A. Magnetic Resonance Imaging

Magnetic resonance imaging (MRI) refers generally to form of clinical imaging based upon the principles of nuclear magnetic resonance (NMR). Any nucleus which possesses a magnetic moment will attempt to align itself with the direction of a magnetic field, the quantum alignment being dependent, among other things, upon the strength of the magnetic field and the magnetic moment. In MRI, a uniform magnetic field $B_0$ is applied to an object to be imaged; hence creating a net alignment of the object's nuclei possessing magnetic moments. If the static field $B_0$ is designated as aligned with the z-axis of a Cartesian coordinate system, the origin which is approximately centered within the imaged object, the nuclei which possess magnetic moments precess about the z-axis at their Larmor frequencies according to their gyromagnetic ratio and the strength of the magnetic field.

Water, because of its relative abundance in biological tissues and its relatively strong net magnetic moment $M_z$ created when placed within a strong magnetic field, is of principle concern in MR imaging. Subjecting human tissues to a uniform magnetic field will create such a net magnetic moment as a result of the random order of nuclear precession about the z-axis. In a typical imaging sequence, a radio frequency (RF) excitation signal, centered at the Larmor frequency, irradiates the tissue with a vector polarization which is orthogonal to the polarization of $B_0$. Continuing our Cartesian coordinate example, the static field is labeled $B_z$ while the perpendicular excitation field $B_1$ is labeled $B_{xy}$. $B_{xy}$ is of sufficient amplitude and duration in time, or of sufficient power to nutate (or tip) the net magnetic moment into the transverse (x-y) plane giving rise to $M_{xy}$. This transverse magnetic moment begins to collapse and re-align with the static magnetic field immediately after termination of the excitation field $B_1$. Energy gained during the excitation cycle is lost by the nuclei as they re-align themselves with $B_0$ during the collapse of the rotating transverse magnetic moment $M_{xy}$.

The energy is propagated as an electromagnetic wave which induces a sinusoidal signal voltage across discontinuities in closed-loop receiving coils. This represents the NMR signal which is sensed by the RF coil and recorded by MRI system. A slice image is derived from the reconstruction of these spatially-encoded signals using well known digital image processing techniques.

B. Local Coils

The diagnostic quality or resolution of the image is dependent, in part, upon the sensitivity and homogeneity of the receiving coil to the weak NMR signal. RF coils, described as "local coils" may be described as resonant antennas, in part, because of their property of signal sensitivity being inversely related to the distance from the source. For this reason, it is important to place the coils as close to the anatomical region-of-interest (ROI) as possible.

Whereas "whole body" MRI scanners are sufficiently large to receive and image any portion of the entire human body, local coils are smaller and therefore electromagnetically couple to less tissue. Coupling to less tissue gives rise to coupling to less "noise" or unwanted biologically or thermally generated random signals which superimpose upon the desired MR signal. The local coils may be of higher quality factor (Q) than the body coils due to their smaller size. For all of these reasons, local coils typically yield a higher signal-to-noise (S/N) ratio than that obtainable using the larger whole body antenna. The larger antenna is commonly used to produce the highly homogenous or uniform excitation field throughout the ROI, whereas the receiver coil is placed near the immediate area of interest to receive the NMR signal. The importance of accurate positioning leads to the development of local coils which conform to the anatomy of interest, yet function to permit ease of use.

The S/N of the NMR signal may be further increased by orienting two coils, or coil pairs about the imaged object so that each detects RF energy along one of a pair of mutually perpendicular axes. This technique is generally known as quadrature detection and the signals collected are termed quadrature signals.

The outputs of the quadrature coils are combined to as to increase the strength of the received signal according to the simple sum of the output signals from the coils. The strength of the noise component of these signals, however, will increase only according to the square root of the sum of the squares of the uncorrelated noise components. As a result, the net S/N of the combined quadrature signals increases by approximately the square root of 2 over the S/N of the individual signals.

The quadrature orientation of the two coils introduces a 90° phase difference between the NMR signals detected by these coils. Therefore, combining the outputs from the two quadrature coils, to achieve the above described signal-to-noise ratio improvements, requires that one signal be shifted to have the same phase as the other signal so that the amplitudes of the signals simply add in phase.

Such phase shifting and combining is typically accomplished by means of a hybrid network. Hybrid networks or combiners, are four-port networks known in the art and having the property that when the four-ports are properly terminated, energy input to two of the ports, with the proper magnitude and relative phase angles, will be combined at one of the remaining two ports. The resonant antennas are attached to two of the ports and the output lead is attached to a third port. The remaining port is connected to a termination resistor. An important characteristic of the hybrid network is that the impedance at each port may be readily matched to the impedance of the attached coils, output lead, and terminating resistor to reduce energy loss due to reflections at points of impedance mismatches.

A further property of commercially available hybrid combiners is that they provide a degree of isolation between ports of the hybrid combiner. This isolation is actually a radio-frequency isolation between center-conductor terminals of the two-terminal ports. Additional isolation circuitry must be employed to ensure sufficient isolation between the input ports of the two quadrature antennas. As the coils are resonant antennas, they are sensitive to "parasitic" or alternate RF current paths which provide shunt reactance to a portion of the tuned reactance circuitry of the coils. The common ground plane of the hybrid circuit provides such a shunt impedance and hence, detunes the individual coil elements when they are supposed to be tuned.

Local coils, if used in the more typical configuration as receive-only coils, must be detuned or decoupled from the nearby transmit antenna for several reasons. Faraday's law states that currents will be induced on a closed loop whose surface area links with changing magnetic flux. The proximity and power of the MR system transmit antenna would therefore induce substantial currents on a resonant local coil during the transmit portion of the MR imaging sequence. These induced currents are undesirable as they would result in distortion of the otherwise homogenous magnetic field, they would re-radiate electromagnetic energy into the nearby patient, and they would most likely be of sufficient energy to destroy the local coil circuitry. Decoupling is typically accomplished by electronically detuning the local coil or inserting a resonant trap within the coil's RF current loop which offers high impedance to RF currents on and about the frequency of the transmitter.

SUMMARY OF THE INVENTION

It is an object of the present invention to provide an improved NMR local coil designed to conform to a patient's particular anatomical region and place antenna conductors within close proximity to all of said anatomy versus only on the outer surfaces of the anatomy.

Another object is to provide an NMR local coil with an antenna geometry which is operable to permit ease of positioning on or about the patient anatomy.

Still another object is to provide an NMR local coil with a set of coil conductors which closely couple their regions of sensitivity to the desired region of a patient in a quadrature fashion.

Yet another object is to provide an NMR local coil with an improved hybrid combiner input port isolation and hence the quadrature signal combination of two coils.

Another object of the present invention is to provide an NMR local coil with improved electronic configurations of coil conductors which yield a higher signal-to-noise and improved homogeneity of sensitivity profiles.

The NMR shoulder coil of the present invention includes a generally ring-shaped transverse parallel-wound solenoidal coil oriented in a vertical plane. Annular anterior and posterior parallel-wound solenoids are mounted perpendicularly and diametric to the transverse vertical coil. The anterior and posterior solenoids are preferably mounted in planes which are approximately 30° from parallel to one another and diverge medially.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference must be made therefore to the claims herein for interpreting the scope of the invention.

DESCRIPTION OF THE PREFERRED EMBODIMENT

Figure 1:
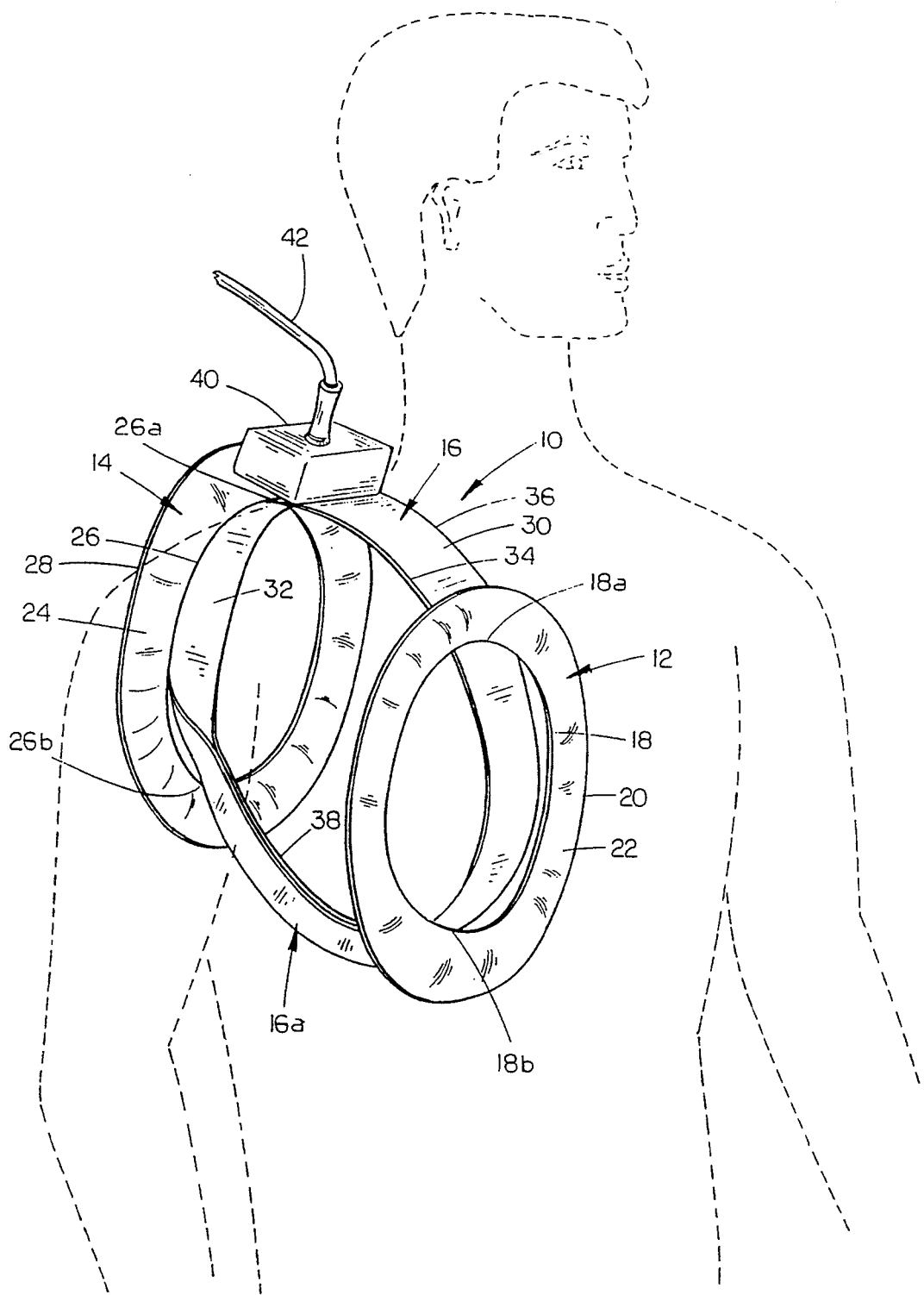
FIG. 1 is a perspective view of the NMR shoulder coil of the present invention, with a patient shown in broken lines.

Referring now to the drawings, the NMR shoulder coil of the present invention is designed generally at 10 and includes opposed anterior and posterior generally annular housings 12 and 14, respectively, separated by transverse annular housing 16.

Annular housing 12 is a generally planar annulus having coplanar inner and outer edges 18 and 20, a planar forward wall 22 and a planar rearward wall (not shown). Anterior housing 12 is formed from a resilient semi-flexible plastic with a multiple-turn inductor loop antenna embedded therein for connection to the NMR equipment. Preferably, a semi-flexible circuit board material or flexible conductor is utilized to form the loop antenna, to permit a garment-like fit of the antenna to the patient.

Posterior housing 14 is essentially identical to anterior housing 12, and is spaced approximately 30° from parallel thereto by transverse housing 16. Posterior housing 14 is a planar annulus having a planar forward wall 24 and coplanar inner and outer edges 26 and 28 respectively. Posterior housing 14 is formed of a resilient generally semi-flexible plastic with a multi-turn inductor loop antenna embedded therein for connection to NMR imaging equipment.

Transverse housing 16 is also formed of a resilient semi-flexible plastic material with a parallel-wound solenoid embedded therein and electrically connected to the NMR imaging equipment. Transverse housing 16 is a generally ring-shaped member oriented in a generally vertical plane transverse to the planes of anterior and posterior housings 12 and 14, and includes an outer generally cylindrical wall 30, an inner generally cylindrical wall 32 parallel to outer wall 30 and a pair of opposing side edges 34 and 36.

Housing 16 is mounted to anterior and posterior housings 12 and 14 at the intersection of outer wall 30 with the inner edges 18 and 26 respectively of anterior and posterior housings 12 and 14 respectively. As shown in the drawings, the intersection of transverse housing 16 with anterior housing 12 occurs at generally diametric portions of inner edge 18, designated at 18a and 18b, respectively. Similarly, outer wall 30 of housing 16 is mounted to posterior housing 14 at diametric portions of inner edge 26, designated at 26a and 26b respectively.

The lower half of transverse housing 16 is folded such that lengths of side edges 34 and 36 are abutting one another to form a joined edge 38. Joined edge 38 forms an arcuate generally bulbous section 16a of transverse housing 16 which extends generally between the lower intersections 18b and 26b of housing 16 with anterior and posterior housings 12 and 14.

A box 40 is mounted to the outer wall 30 of transverse housing 16 and a portion of the forward wall 24 of posterior housing 14 and houses electronic circuitry for operating the inductor loops and solenoid embedded within housings 12, 14 and 16. An electrical cable 42 extending from box 40 electrically connects shoulder coil 10 with the NMR imaging equipment.

In operation, a patient will extend an arm through the opening formed by transverse housing 16 with anterior housing 12 located against the patient's chest. The bulbous section 16a of transverse housing 16 rests within the armpit of the patient and provides high sensitivity to the most inferior aspect of the shoulder joint with minimal discomfort. Posterior housing 14 is located generally parallel to anterior housing 12 on the opposing side of the patient's body, with box 40 connected to the portion of transverse housing 16 resting on the top of the shoulder. The resilient semi-flexibility of housings 12, 14 and 16 permits accurate positioning of the shoulder coil 10 so as to closely conform to the anatomy of the shoulder.

Figure 2:
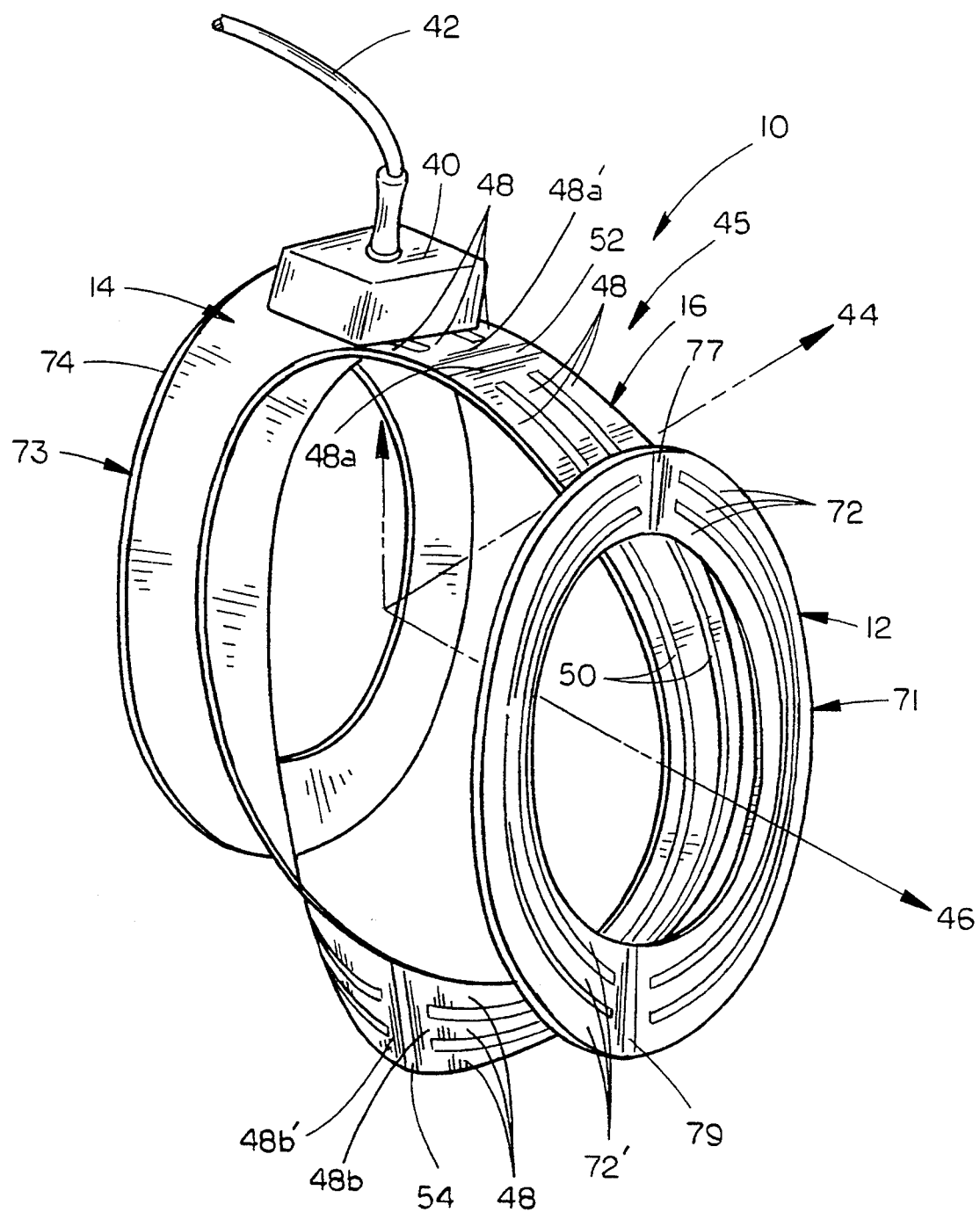
FIG. 2 is a perspective view similar to FIG. 1, but with portions of the housings removed to show in schematic form, the tuning, detuning, matching, isolation, signal combiner networks, and improved conductor configurations of the coil.

Referring to FIG. 2, the transverse antenna loop 45 within housing 16 will be predominantly sensitive to field components along a horizontal axis of sensitivity 44 (in accordance with the Biot-Savart relationship between electrical currents and magnetic fields) in a region of interest approximating the shoulder anatomy centered within loop 16 and between the anterior and posterior loops 12 and 14. Conversely, the anterior and posterior loops 12 and 14 which form a Helmholtz pair, as a result of their rotation displacement about loop 16, will be predominately sensitive to field components along a horizontal axis of sensitivity 46 perpendicular to axis 44. Thus in the region of interest, the transverse loop 16 and the combined anterior and posterior loops 12 and 14, act like quadrature antenna loops to receive quadrature signals from a magnetic vector moving in the XY plane, such as that of an NMR signal, within the region of interest.

Figure 3:
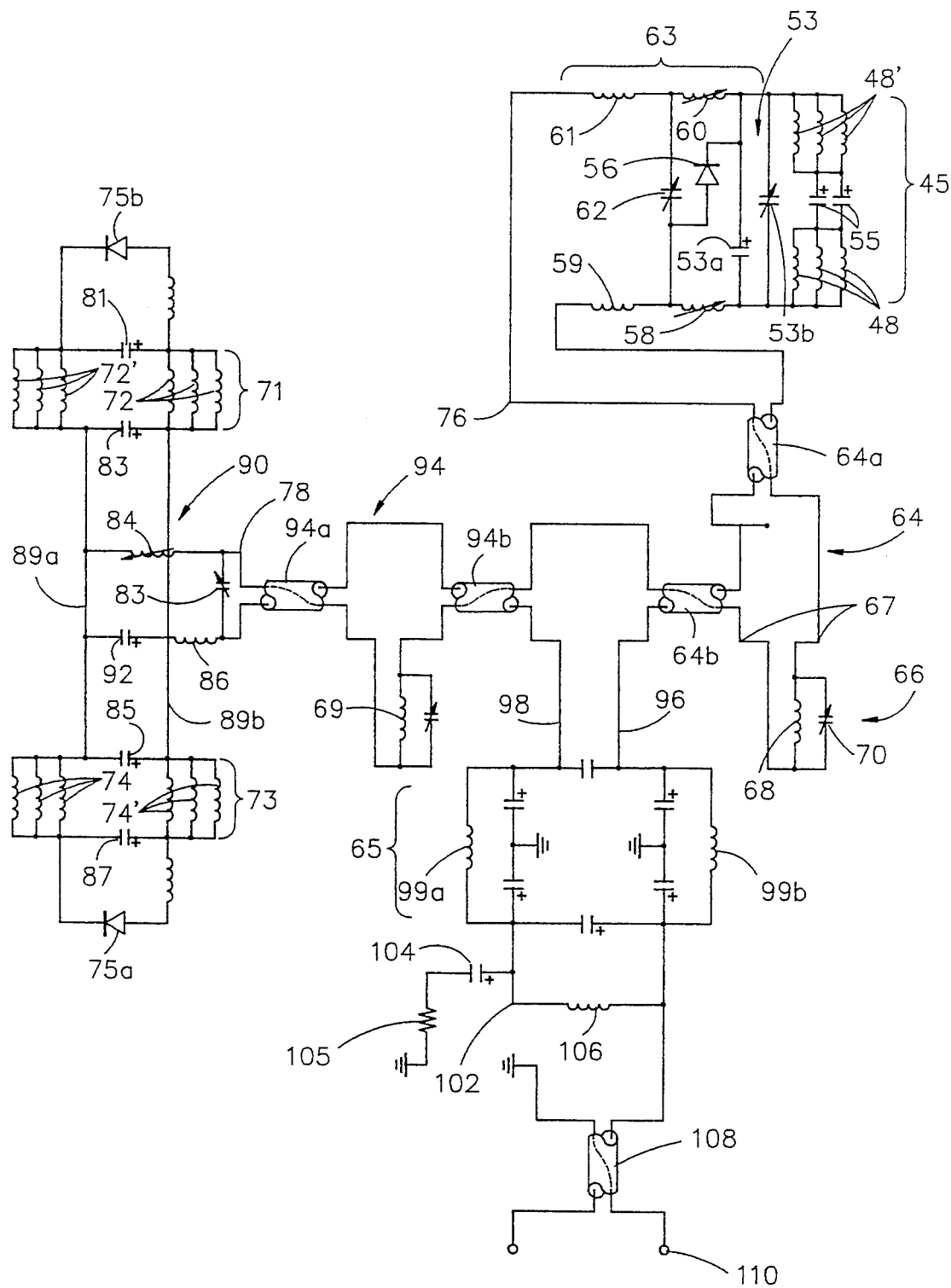
FIG. 3 is a simplified electrical schematic of the antenna loops and the circuitry of FIG. 2.

Referring now to FIGS. 2 and 3, the transverse antenna loop 16 is constructed from three or four (depending upon the size of the shoulder coil assembly) ribbon conductors 48 following the distorted annulus form of housing 16 in a parallel fashion. The conductors 48 are separated by a fixed distance or gaps 50 whose widths are determined by the width of the conductors 48 and by principles of solenoid design known by those skilled in the art. The ends of parallel ribbon conductors 48 are joined by thin conductors 48a and 48b.

As shown in FIGS. 2, a second set of ribbon conductors 48' are oriented in end-to-end relation with conductors 48, to form the distorted annulus shape of housing 16. The ends of conductors 48' are joined by their conductors 48a' and 48b', similar to conductors 48. The adjacent ends of conductor sets 48 and 48' are separated by a gap 52 between thin conductors 48a and 48a' and a gap 54 between thin conductors 48b and 48b'. This configuration forms a parallel-wound solenoid 45 with two discontinuities, gaps 52 and 54, across which tuning capacitors (not shown in FIG. 2) are placed. Fixed capacitors 53a and 55 across each gap 52 and 54 are distributed across the length of conductive strips 48a, 48a' and 48b and 48b' and are effectively in series with the inductive elements of 48 and 48' and collectively determine the resonant frequency of the solenoid 45. A trimmer capacitor 53b is installed across gap 52 for precise adjustment to the resonant frequency.

The parallel-wound solenoidal coil 45 offers several advantages over "true" solenoids and single loops. True solenoids are those solenoids wound with a single conductor wound in a series of turns while the parallel-wound coil 45 has all conductor turns connected in parallel. The first advantage that the parallel-wound solenoid 45 offers over the above mentioned designs is that of coil Q or quality factor. A coil with higher loaded and unloaded coil Q offers a higher signal-to-noise ratio than a coil with lower Q. Coil 45 has a higher Q than a similarly sized coil with only a single conductor turn or a series-wound solenoid. This is explained by the fact that the series resistance is reduced in the parallel conductor configuration as compared to a single or series wound conductor configuration. Quality factor is inversely proportional to the series resistance, therefore the parallel-wound coil has a higher Q.

Those skilled in the art realize that the sensitivity profiles of true solenoids are, without question, more homogeneous than the profiles of single-turn resonant loops of equal cross-sectional dimension. A properly designed parallel-wound solenoid has nearly the identical sensitivity profile as the series wound solenoid; therefore, the parallel-wound solenoid offers an improved uniformity of sensitivity over the single turn loop antennas.

Solenoids also offer deeper flux penetration into the object compared to single turn loops if the solenoids are oriented such that the end of the solenoid is facing the region of interest (in this situation, the patient). All coil geometries in this coil set employ such solenoids.

Two additional and identical parallel-wound solenoids 71 and 73 are formed on housings 12 and 14 wherein said housings provide the proper geometric spacing and angulation of the solenoids 71 and 73 (described above) such that they operate in unison as an axially positioned Helmholtz pair with associated strong inductive coupling.

Solenoid 71 is comprised of parallel ribbon conductors 72 and 72' whose ends abut one another across gaps 77 and 79 in similar fashion as the configuration of solenoid 45. Capacitors 81 and 83 are distributed across the gaps 77 and 79 similar to the distribution of capacitors 53 (capacitance 53a and 53b) and 55 in solenoid 45 (described above). The series connections of conductors 72, 72', and capacitors 81 and 83 form the resonant solenoid 71. An identical circuit composed of conductors 74, 74' and capacitors 85 and 87 forms the resonant solenoid 73.

Wires 89a and 89b capacitively connect the solenoidal pairs 71 and 73. Wire conductor 89a joins the medial terminal of capacitor 83 to the medial terminal of capacitor 85, while conductor 89b connects the lateral terminals of capacitors 83 and 85. This ensures parallel current flow in the two solenoids 71 and 73.

The NMR signal output from solenoid 45 is combined with the NMR signal output from the Helmholtz pairs comprised of solenoids 71 and 73, via electrical connections to the four-port combiner circuit 65 at ports 96 and 98. The combined NMR signal output from combiner 65 appears at port 100 and is transmitted to the NMR system via coaxial cable 108.

Referring again to FIG. 3, capacitors 53 (in total, a junction capacitor) are shunted with a series-connected diode 56 and adjustable inductor 58 which together with capacitors 53 forms a bias-activated decoupling network. As is understood in the art, the diode 56 is a non-linear conductor which has a very high resistance for voltages below a forward bias voltage (approximately 0.7 volts for silicon diodes) and low resistance for voltages above this threshold. When the system-provided bias voltage is less than 0.7 volts across the diode, as is the case when the system is in the "receive" mode, the inductor 58 is effectively removed from the tuning circuitry of the solenoid 45. When the voltage across the junction capacitor 53 exceeds 0.7 volts, as in the case when the system is in the "transmit" mode, the diode 56 conducts and inductor 58 is electrically connected across the junction capacitor 53. The variable inductor 58 and capacitor 53 together form a parallel tank circuit which offers high impedance to RF currents about a range of frequencies centered on the resonant frequency of the tank circuit. Inductor 58 and capacitor 53 have been selected and tuned to offer parallel resonance at the frequency of the transmit pulse of the MR system so that they prevent currents otherwise induced onto the solenoidal coil 45 by the transmit field $B_1$; hence, decoupling the local coil.

Inductors 58-61 and capacitor 62 form a balanced impedance matching network 63 which matches the loaded solenoidal coil 45 impedance developed across junction capacitor 53 to the impedance of the transmission line 64 which carries the NMR signal developed by solenoid 45 to the quadrature combiner 65. Inductors 58 and 59 connect serially to one terminal of capacitor 53, with inductor 59 terminated at the center pin of coaxial cable 64a. Similarly, inductors 60 and 61 connect serially to the second terminal of capacitor 53 with inductor 61 terminated at the shield conductor of coaxial cable 64a. Inductor 60 and capacitor 62 are variable to allow for adjustment of the matching network 63 to the impedance developed across capacitor 53.

The advantage of the impedance matching circuit 63 is that the coil 45 operates in a floating potential mode whereby the system RF ground is not placed upon the coil at any point. This offers advantages of reduced electric field coupling variations between the local coil 45 and surrounding MR system conductors (not shown). This in effect helps to maintain the tuned frequency of the local coil 45 when it is placed in proximity to the MR system, but at various distances from the MR system conductors.

The transmission line 64 is divided into two segments 64a and 64b by a radio frequency trap circuit 66 which offers high impedance to currents flowing on the transmission line shield conductor 67 at the frequency of the antennas.

Referring to FIGS. 2 and 3, components of the RF traps 66 and 69 form a parallel LC tank circuit as described above with inductor 58 and capacitor 53. The purpose of traps 66 and 69 is to prevent a low impedance RF shunt which would otherwise exist (without traps 66 and 69) between the tuned circuits of solenoidal coil 45 and the tuned solenoids 71 and 73 mounted on the anterior and posterior housings 12 and 14. This RF shunt would be between conductors 76 of solenoid coil 45 and conductor 78 and coil pair 71, 73 respectively.

Referring again to FIG. 3, inductors 84 and 86 and capacitor 88 form a balanced impedance matching network 90 which matches the loaded solenoidal coil pair (71 and 73) impedance developed across junction capacitor 92 to the impedance of the transmission line 94 as described above. The received NMR signal from antenna solenoids 71 and 73 (on forms 12 and 14) is 90 degrees out of phase with that received signal from antenna solenoid 45 (due to the inherent magnetic flux sensitivity vectors of the two-previously mentioned) as it appears at the combiner 65.

Inductor 84 connects to the interconnecting wire 89a of solenoids 71 and 73 whereas inductor 86 connects to the interconnecting wire 89b. The other terminals of impedance-matching inductors 84 and 86 are terminated to the coaxial cable transmission line segment 94a (shield and center conductor, respectively) as well as to each of two terminals of an adjustable capacitor 88 which serves, in conjunction with inductors 84 and 86, to adjust the impedance of solenoids 71 and 73 to the impedance of the transmission line 94a. The radio frequency trap 69 functions identically as trap 66 described above. Traps 66 and 69 are electrically identical so as not to introduce any phase difference in the two NMR signals passing through them; these signals being generated in solenoids 45, 71 and 73.

Figure 4:
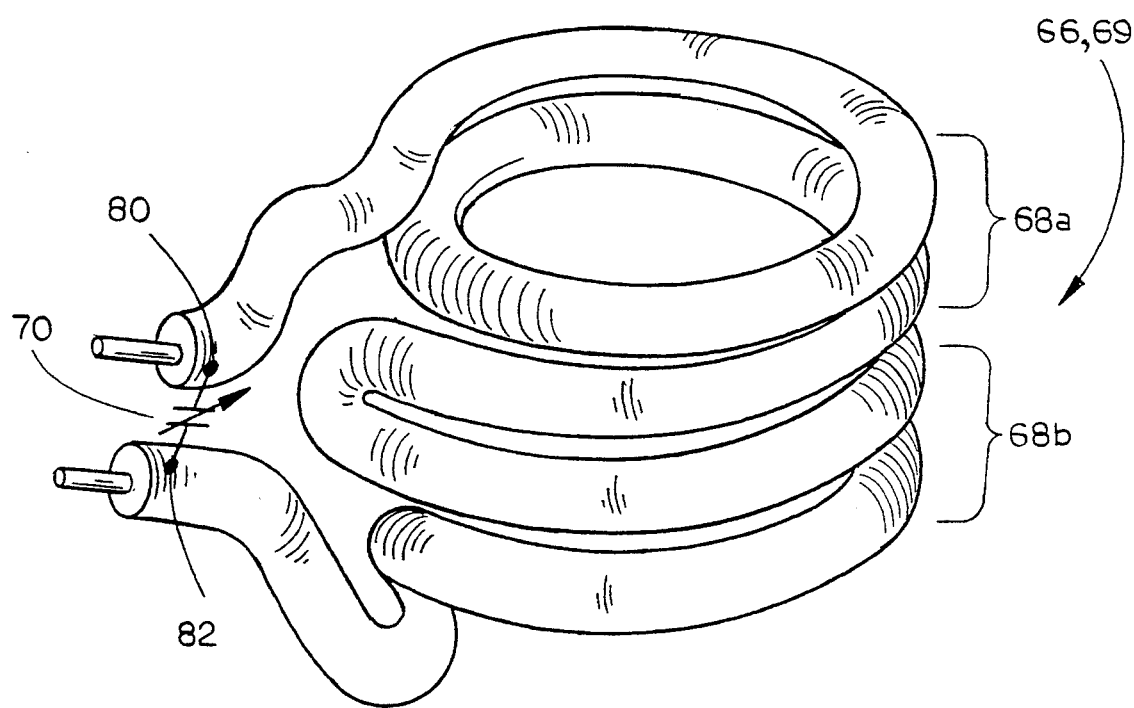
FIG. 4 is a perspective view of the RF trap assembly.

FIG. 4 depicts the physical realization of the identical RF cable trap circuits 66 (shown) and 69. This configuration offers advantages over other trap circuits in that it utilizes 100% electromagnetically shielded semi-rigid coaxial cable to form the inductor 68 of the trap, thereby isolating the primary signal carrying center conductor from electromagnetic interference. The coaxial cable 68 also maintains a fixed impedance as compared to printed circuit board configurations whose impedance is difficult to maintain due to coupling to the external environment. Other advantages are that the RF trap is very compact in size compared to printed circuit board versions and it offers intrinsic isolation to external changing magnetic fields. This intrinsic isolation implies that changing magnetic fields will not create a voltage across the closed ends 80 and 82 of the inductor loop 68 as it has been wound with equal numbers of turns in opposite directions, with the individual turns or loops lying directly on top of one another with small insulative spacing in between. A continuous piece of cable 68 is wound around a non-conductive form with two turns clockwise 68a and two turns counterclockwise 68b as shown. Inductance is created by the electrical length of the entire cable assembly 68. A capacitor 70 is connected to the shield at each end 80 and 82 of the coaxial cable 68 forming a RF trap circuit as previously described.

The four port combiner 65 discussed above serves as a phase shifter and signal adder for the two quadrature input signals appearing at ports 96 and 98. If the signals enter the combiner 65 with the proper phase relationship and equal amplitudes as expected, then the output signal will be twice the inputs and appear at port 100 for transmission to the MR system preamplifier via a transmission line 108. A high impedance RF choke 106 appears between 100 and 102 for the purpose of providing a direct current (DC) path from the system center conductor 110 via inductors on the combiner 99a and 99b and the transmission line segments 64 and 94 to the decoupling diodes 56, 73 and 75. The choke 106 offers high impedance to RF so as to maintain the RF isolation intended between ports 100 and 102 by the combiner design. A fact well known to these skilled in the art is that a high degree of isolation is required between individual coil elements that are intended to work in quadrature.

As a DC bias now appears at 102 where a low resistive load 105 is required by the combiner, the DC currents must be blocked to prevent excessive draw upon the DC power supply by the low impedance 105. This DC blocking is accomplished by capacitor 104.

The above description has been that of a preferred embodiment of the present invention. For example, the above invention is not limited to coils for shoulder imaging such as shown in FIGS. 1 and 2, but may be employed in other local coils for use with MRI such as a cardiac or abdominal coil which conforms to and rests upon the chest or stomach. In order to apprise the public of the various embodiments that may fall within the scope of the invention, the following claims are made:

I claim:

1. A RF local coil set for use in detecting an RF field in MRI comprising:
    a first resonant solenoidal antenna oriented such that it is sensitive to RF magnetic flux changes along a first linear axis in a volume;
    means connected to said first antenna for transmitting a signal to an MRI system as a first output, in response to the first antenna sensing an NMR signal along said first linear axis;
    second and third solenoidal antennas electrically connected and oriented with respect to one another to sense RF magnetic flux changes along a second linear axis, said second axis orthogonal to, and centered within the same volume as, the first axis;
    means connected to said second and third antennas for transmitting a signal to the MRI system as a second output, in response to the second and third antennas sensing an NMR signal along said second axis;
    said first antenna electrically connected in an electrically quadrature sense with the second and third antennas; and
    said means for transmitting said first and second outputs to the MRI system including
    means for quadrature summing said first and second outputs and transmitting a
    summed output to the MRI system.

2. The RF coil set of claim 1 wherein said first antenna includes a plurality of parallel conductors electrically configured to form a parallel-wound solenoid.

3. The RF coil set of claim 2, wherein each of said second and third antennas includes a plurality of parallel conductors electrically configured to form a parallel-wound solenoid.

4. The RF coil set of claim 3, wherein said conductors of said first, second and third solenoids are spaced and oriented to increase deep-seated NMR signal reception sensitivity.

5. The RF coil set of claim 1:
    further comprising means for tuning each of said first, second and third antennas to a resonant frequency;
    wherein said first and second outputs are impedance outputs; and
    wherein said means for quadrature summing includes means for phase-shifting said first and second outputs.

6. The RF coil set of claim 5, further comprising means for matching the impedance of said first and second outputs, said impedance matching means adapted to prevent system RF grounding effects on said antennas.

7. The RF coil set of claim 1, wherein:
    said first antenna is generally ring-shaped and oriented in a generally vertical plane;
    said second antenna is configured in a generally planar annular shape and oriented with its plane perpendicular to said first antenna plane; and
    said third antenna is configured in a generally planar annular shape and oriented with its plane perpendicular to said first antenna plane;
    said second and third antennas located transverse to and on diametric sides of said first antenna.

8. The RF coil set of claim 7, wherein said second and third antennas are oriented with their planes diverging downwardly.

9. The RF coil set of claim 1, wherein said first antenna includes a plurality of annular conductors uniformly spaced apart within a cylindrical plane and electrically connected in parallel, to form a generally cylindrical parallel-wound solenoid.

10. The RF coil set of claim 9, wherein:
    said second antenna includes a plurality of concentric annular conductors uniformly spaced apart within a single plane and electrically connected in parallel, to form a parallel-wound solenoid; and
    said third antenna includes a plurality of concentric annular conductors uniformly spaced apart within a single plane and electrically connected in parallel, to form a parallel-wound solenoid.

11. The RF coil set of claim 1, further comprising electrical isolation network means electrically connected to said first, second and third antennas for isolating said antennas from external RF transmit pulses.

* * * * *